United States Patent [19]

Fuller et al.

[11] Patent Number: 4,956,306
[45] Date of Patent: Sep. 11, 1990

[54] METHOD FOR FORMING COMPLEMENTARY PATTERNS IN A SEMICONDUCTOR MATERIAL WHILE USING A SINGLE MASKING STEP

[75] Inventors: Robert T. Fuller, Durham; Joseph C. Tsang, Raleigh; William R. Richards, Jr., Cary, all of N.C.

[73] Assignee: Harris Corporation, Melbourne, Fla.

[21] Appl. No.: 266,756

[22] Filed: Nov. 3, 1988

[51] Int. Cl.$^5$ .................................. H01L 21/265
[52] U.S. Cl. ................................ 437/34; 437/962; 148/DIG. 105
[58] Field of Search .................... 437/34, 29, 28, 27, 437/962, 105; 148/DIG. 105

[56] References Cited

U.S. PATENT DOCUMENTS

| | | | |
|---|---|---|---|
| 4,448,800 | 5/1984 | Ehara et al. | 427/39 |
| 4,578,859 | 4/1986 | Hause et al. | 437/34 |
| 4,584,027 | 4/1986 | Metz, Jr. et al. | 437/18 |

FOREIGN PATENT DOCUMENTS 58-138068   8/1983   Japan ................................ 437/34

OTHER PUBLICATIONS

Brown et al., *Selective CVD Tungsten Via Plugs for Multilevel Metallization*, pp. 66–69, Technical Digest of the International Electron Devices Meeting (IEEE), Los Angeles, Calif., Dec. 7–10, 1986.

*Primary Examiner*—Olik Chaudhuri
*Attorney, Agent, or Firm*—Stephen A. Young; Paul Checkovich

[57] ABSTRACT

A semiconductor material is overlayed with sequentially stacked layers including a protective layer, an affinity layer having an affinity for a second implant blocking material comprising tungsten, a first implant blocking layer and a masking layer having a first pattern. A portion of the first blocking layer not being masked is removed to expose a first portion of the affinity layer and a first dopant is implanted into the underlying semiconductor through the exposed first portion of the affinity layer. The mask is removed to expose the first blocking layer and a second blocking layer is formed from the second blocking material over the exposed first portion of the affinity layer but not over the exposed first blocking layer. The first blocking layer is removed to expose a second portion of the affinity layer which constitutes a second pattern. A second dopant is implanted into the underlying semiconductor through the exposed second portion of the affinity layer. The first blocking layer may include silicon oxide, the second blocking layer may include tungsten and the affinity layer may include polysilicon.

19 Claims, 2 Drawing Sheets

METHOD FOR FORMING COMPLEMENTARY PATTERNS IN A SEMICONDUCTOR MATERIAL WHILE USING A SINGLE MASKING STEP

BACKGROUND OF THE INVENTION

This invention relates to a method for forming two complementary patterns during processing of a semiconductor material while using a single masking step, and, more particularly, to a method for doping semiconducting material with different types of dopants and/or different concentrations of the same dopant, such as to form N-type and P-type semiconductor regions, while using a single masking step.

In forming semiconductor integrated circuits, it may be necessary or desirable to form complementary patterns, or regions, such as N-type and P-type, disposed in a semiconducting material like silicon. Complementary patterns are used to define a first area of an object wherein it is desired to perform a first action, such as dopant implantation, on the first area while blocking a second area of the object from the first action and then performing a second action, such as dopant implantation, on the second area while blocking the first area from the second action.

A common method uses two masking steps. In the first step a portion of a semiconductor material is masked and a first dopant is implanted in the unmasked part of the semiconductor material. For the second step, the part of the semiconductor material having received the first dopant is masked and a portion of the semiconductor material that was previously masked is unmasked so that a second dopant can be implanted therein. For example, when the semiconductor material comprises silicon, the first dopant may be phosphorous or arsenic for providing an N-type region and the second dopant may be boron for providing a P-type region.

Two masking steps result in increased processing costs, increased process complexity (the second mask must be properly aligned and registered) and generally cause reduced yield of desired components over that achievable using one masking step. Therefore, it would be desirable to eliminate one masking step so that complementary patterns could be formed using a single masking step.

Another method, which uses a single masking step, employs a lift-off process. A first masking pattern of photo resist is established on the surface of the semiconductor material, which leaves predetermined portions of the surface of the semiconductor exposed. A first dopant is implanted into the semiconductor material through the portion of the exposed surface. A second masking pattern is formed by depositing metal over the photo resist of the first pattern and over the first implanted regions of the semiconductor. The photo resist along with the metal deposited on it is removed, leaving behind the metal overlaying the first implanted regions, which constitutes the second mask pattern. A second dopant is implanted through the parts of the surface of the semiconductor material that were previously covered by the photo resist of the first pattern and then the remaining metal is removed.

There are disadvantages associated with this lift-off technique. Metal deposition is typically performed in a high vacuum metal deposition system which requires subjecting the semiconductor material along with the photo resist of the first pattern to a high vacuum, such as less than about 10 m Torr. Photo resist as generally used for masking includes solvents that outgas when exposed to the vacuum, potentially contaminating the deposition process and rendering it harder to control. If the contamination is severe enough, the circuit may cease to function.

It would be desirable to provide a single masking step that could be used along with dopant implantation of semiconductor material that could accurately and reproduceably form complementary patterns in the semiconductor material. Further, it would be desirable to have a masking process that is easy to control and that is compatible with existing semiconductor processing technology.

Accordingly, it is an object of the present invention to provide a method for forming complementary patterns while using a single masking step, wherein the method is easy to control and is compatible with existing semiconductor processing technology.

Another object is to provide a method that can accurately and reproduceably form complementary patterns in a semiconductor material while using a single masking step.

SUMMARY OF THE INVENTION

In accordance with the present invention, a method for fabricating complementary regions in a semiconductor material while using a single masking step comprises forming a protective layer on a portion of the semiconductor material, forming an affinity layer having an affinity for a second implant blocking material over a portion of the protective layer, forming a first implant blocking layer on a portion of the affinity layer, masking a predetermined portion of the first implant blocking layer for forming a first pattern of the unmasked portion of the first implant blocking layer, removing a part of the unmasked first implant blocking layer in the first pattern for exposing an underlying first part of the affinity layer, implanting a first dopant at the exposed first part of the affinity layer into the underlying semiconductor material, removing the masking for exposing a portion of the predetermined portion of the first implant blocking layer, forming a second implant blocking layer from the second implant blocking material over a portion of the exposed first part of the affinity layer, removing the first implant blocking layer for exposing an underlying second part of the affinity layer, the exposed second part of the affinity layer constituting a second pattern, and implanting a second dopant at the exposed second part of the affinity layer into the underlying semiconductor material.

The semiconductor material may include bulk silicon, bulk silicon with an epitaxial layer of silicon, or an insulator, such as sapphire, having an epitaxial layer of silicon. The first blocking layer may include silicon oxide while the affinity layer may include polysilicon when the second blocking material includes tungsten. The first and second dopants may be selected from the group including boron, phosphorus, arsenic, antimony and combinations thereof.

The step of forming a second blocking layer may include forming the second implant blocking layer so that the second implant blocking layer does not overlay the exposed portion of the first implant blocking layer. This may be readily accomplished when the first blocking layer includes silicon oxide, the affinity layer includes polysilicon and the second blocking material includes tungsten, since tungsten does not adhere to silicon oxide but does adhere to silicon or polysilicon when processed in accordance with the present invention.

In another aspect of the present invention, in a method for fabricating complementary regions in a semiconductor material while using a single masking step, the semiconductor material has a protective layer disposed over a portion thereof, an affinity layer disposed over a portion of the protective layer (the affinity layer having an affinity for a second implant blocking material) and a first implant blocking layer disposed over a portion of the affinity layer.

The method includes masking a predetermined portion of the first blocking layer for forming a first pattern of the unmasked portion of the first implant blocking layer, removing a part of the unmasked first implant blocking layer in the first pattern for exposing an underlying first part of the affinity layer, implanting a first dopant at the exposed first part of the affinity layer into the underlying semiconductor material, removing the masking for exposing a portion of the predetermined portion of the first implant blocking layer, forming a second implant blocking layer from the second implant blocking material over a portion of the exposed first part of the affinity layer and removing the first implant blocking layer for exposing an underlying second part of the affinity layer (the exposed second part of the affinity layer constituting a second pattern) and implanting a second dopant at the exposed second part of the affinity layer into the underlying semiconductor material.

The step of forming a second blocking layer may include forming the second implant blocking layer so that the second implant blocking layer does not overlay the exposed portion of the first implant blocking layer which may be readily accomplished when the first implant blocking layer includes silicon oxide, the second implant blocking material includes tungsten and the affinity layer includes silicon or polysilicon, inasmuch as tungsten does not adhere to silicon oxide while it does adhere to silicon or polysilicon at first and then to itself as the second implant blocking layer is built up in accordance with the present invention.

The first implant blocking layer may include silicon oxide and have a thickness greater than about 1000 angstroms with the second implant blocking layer being less than or equal to the first implant blocking layer in thickness. When the second implant blocking layer includes tungsten, it is formed at a pressure of about 50 to about 1000 m Torr preferably at a temperature less than about 400° C., yet up to about 600° C. is possible so that the tungsten selectively deposits on the polysilicon and not on the silicon oxide of the first blocking layer.

The features of the invention believed to be novel are set forth with particularity in the appended claims. The invention itself, however, both as to organization and method of operation, together with further objects and advantages thereof, may best be understood by reference to the detailed description taken in connection with the accompanying drawing.

DETAILED DESCRIPTION

Figure 1:
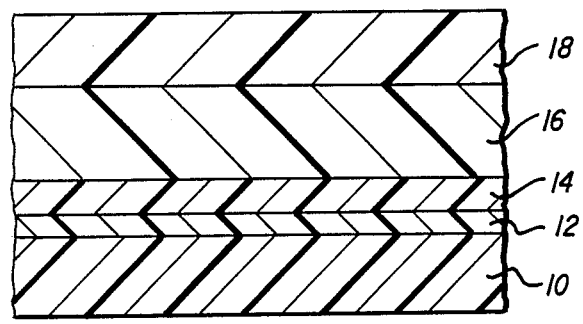
FIGS. 1-7 illustrate cross sections of respective intermediate stages for fabricating a semiconductor device in accordance with the present invention.

Referring to FIG. 1, a cross section of a wafer fabricated in accordance with the present invention is shown. The present invention will be described as it may be used for forming N-type and P-type wells during CMOS device fabrication. However, it is to be understood that the present invention may be employed during any process wherein it is desired to use only a single masking step for acting on a first portion of a material while blocking a second portion from the action, and then to block action on the first portion while acting on the second portion. The Figures are not necessarily to scale.

The wafer includes a semiconductor substrate 10, such as silicon, which may be part of a bulk silicon, an epitaxial layer of silicon disposed on a bulk silicon, or an epitaxial layer of silicon disposed on an insulative substrate, such as sapphire.

A protective layer 12, such as silicon oxide, may be deposited or grown over a portion of substrate 10. Layer 12 protects layer 10 from undesirable contamination during subsequent processing steps and may be greater than about 150 angstroms thick. Affinity layer 14 is deposited over a portion of protective layer 12 to a thickness greater than about 300 angstroms. A part of affinity layer 14 is selectively coated during processing by an implant blocking material, such as tungsten, as explained below. Blocking layer 16, which may comprise the same material as layer 12, is deposited over layer 12. Blocking layer 16 is deposited to a thickness adequate to prevent ion or atom implantation into substrate 10 during subsequent processing, say greater than about 1000 angstroms. A masking layer 18, such as photo resist, is deposited over a portion of blocking layer 16 in a first predetermined pattern.

Figure 2:
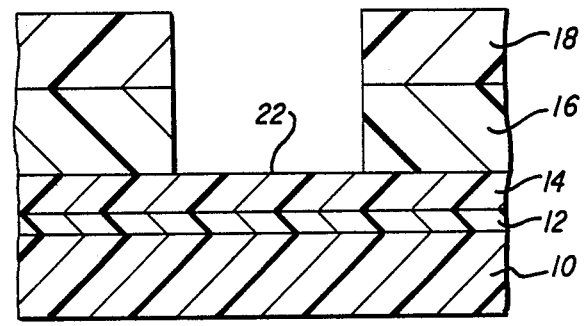

Referring to FIG. 2, a portion of blocking layer 16 that is not covered by layer 18 of the first pattern is removed to expose the underlying surface 22 of affinity layer 14. When blocking layer 16 comprises silicon oxide, it may be removed by plasma etching or reactive ion etching (RIE), typically in an atmosphere of trifluromethane ($CHF_3$).

Figure 3:
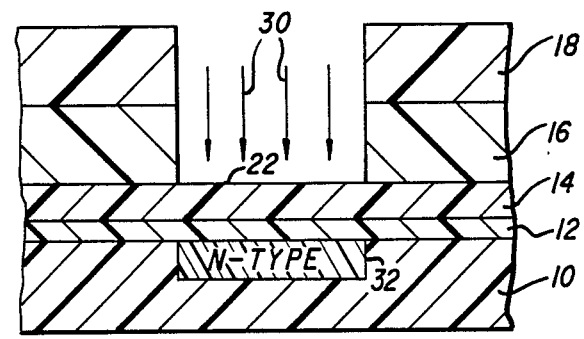

With reference to FIG. 3, processing for forming an N-type region when semiconductor substrate 10 comprises silicon is shown. Conventional implanting techniques using a dopant 30, such as phosphorous atoms, arsenic atoms, antimony atoms or a combination thereof, may be used to implant dopant 30 through layers 12 and 14 into semiconductor layer 10 for achieving the desired doping density and profile of the N-type region. The combination of blocking layer 16 and masking layer 18 has adequate thickness to prevent undesirable implanting of dopant 30 into semiconductor substrate 10 that underlies layer 16.

Figure 4:
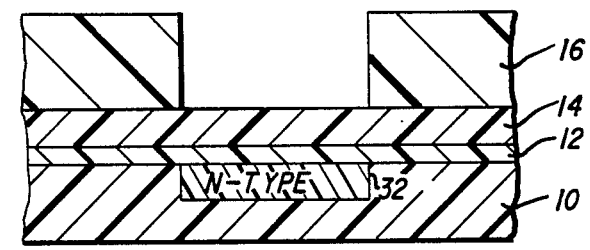
Figure 5:
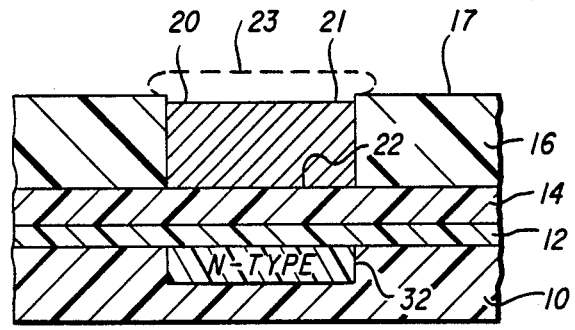

Referring to FIG. 4, masking layer 18 is stripped away, such as may be performed by conventional techniques, typically using a plasma etcher. After layer 18 has been removed, another blocking, or masking, layer 20, such as tungsten, is deposited over exposed surface 22 of affinity layer 14 as shown in FIG. 5. Layer 20 is deposited in adequate thickness to prevent undesirable doping of the portion of substrate 10 that lies under layer 20.

Affinity layer 14 may comprise polysilicon onto which tungsten layer 20 selectively deposits. That is, when blocking layer 16 comprises silicon oxide and affinity layer 14 comprises polysilicon, layer 14 has an affinity for tungsten which will deposit on the polysilicon and not on the silicon oxide when processed in accordance with the present invention. Blocking layer 16 should be deposited and built-up to be thick enough and uniform enough to ensure that there are no small holes therein that could serve as sites for tungsten penetration to layer 14.

Selective deposition of tungsten may be performed by low pressure chemical vapor deposition in an atmosphere of $WF_6$ and $H_2$ at a pressure of about 50 to about 1000 m Torr and at a temperature less than about 400° C., although higher temperatures up to about 650° C. are possible as long as the character of layers 12, 14 and 16 and the electrical properties of semiconductor layer 10 and included dopants are not adversely affected. Apparatus for depositing tungsten is available from GENUS Company, Mountain View, CA. Selective depositing of tungsten is more fully described in "Selective CVD Tungsten Via Plugs for Multilevel Metallization"—Brown et al, *Technical Digest of the International Electron Devices Meeting*, Los Angeles, CA, Dec. 7–10, 1986, which is incorporated herein in its entirety by reference thereto.

It is desirable to deposit layer 20 so that the height of upper surface 21 of layer 20 is as high as or slightly less than the height of upper surface 17 of layer 16. If layer 20 is deposited to extend beyond surface 17 of layer 16, an overflow, or "nailhead", 23 that overlaps onto surface 17 may be created. The overlap may interfere with subsequent processing steps, particularly with accurate placement of dopant at the boundary of adjacent regions.

Figure 6:
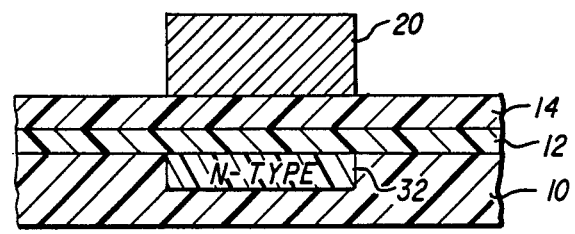

After the deposited layer 20 of tungsten is allowed to cool, the oxide of layer 16 is removed such as by plasma etching or reactive ion etching (RIE), typically in an atmosphere of trifluromethane ($CHF_3$), to expose a portion of layer 14. This exposed portion of layer 14 represents a second pattern with the previously implanted region of substrate 10 blocked from further implantation by layer 20 as shown in FIG. 6. That is, effectively a second mask has been generated and properly registered and aligned with the first mask while using only a single masking step associated with depositing layer 18 (FIG. 1).

Figure 7:
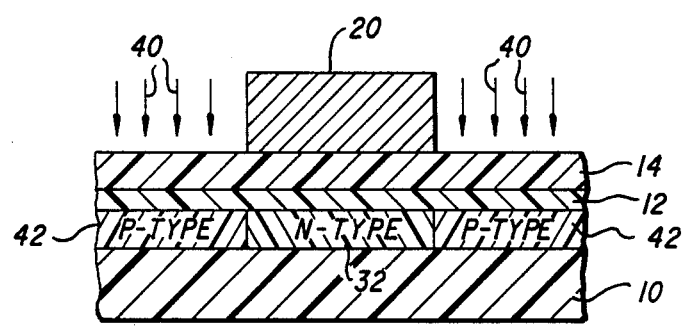

Referring to FIG. 7, processing for forming a P-type region when semiconductor substrate 10 comprises silicon is shown. The P-type region may be adjacent the previously formed N-type region, which results in an intermediate stage useful as a precursor for fabricating many semiconductor devices, such as gate arrays and standard cells. Conventional implanting techniques using a dopant 40, such as boron atoms, and appropriate biasing voltages may be used to implant dopant 40 through layers 12 and 14 into semiconductor layer 10 for achieving the desired doping density and profile of the P-type region. Layer 20 prevents undesirable implanting of dopant 40 into semiconductor substrate 10 and the previously formed N-type region underlying layer 20.

From the resulting precursor as shown in FIG. 7, additional processing may be performed to fabricate desired semiconductor devices. For example, a channel stop of P+-type material may be established between the N-type and P-type regions of substrate 10 for providing LOCOS isolation between the N-type and P-type regions by appropriate masking and implantation of additional boron ions in the P-type region adjacent the N-type region before layer 20 is removed.

It is to be understood that other than for the material constituting affinity layer 14, which must have an affinity for the material of blocking layer 20 during selective deposition of layer 20, and for the material of blocking layer 16, which must not be coated with the material of blocking layer 20 during selective deposition of layer 20, the composition of layers 12, 14, 16, 18 and 20 is not critical, provided that the layers perform their desired function. The materials used as examples herein are generally readily available at, or can be conveniently produced and handled at, semiconducting processing facilities.

Thus has been illustrated and described a method for forming complementary patterns in a semiconductor material while using a single masking step, wherein the method is easy to control and is compatible with existing semiconductor processing technology. Further illustrated and described is a method that can accurately and reproduceably form complementary patterns in semiconductor material while using a single masking step.

While only certain preferred features of the invention have been shown by way of illustration, many modifications and changes will occur to those skilled in the art. It is to be understood that the appended claims are intended to cover all such modifications and changes as fall within the true spirit and scope of the invention.

What is claimed is:

1. A method for fabricating complementary regions in a semiconductor material while using a single masking step, comprising:

forming a protective layer on a portion of the semiconductor material;

forming an affinity layer on a portion of the protective layer, the affinity layer having an affinity for a second implant blocking material, the second implant blocking material comprising tungsten;

forming a first implant blocking layer on a portion of the affinity layer;

masking a predetermined portion of the first implant blocking layer for forming a first pattern of the unmasked portion of the first implant blocking layer;

removing a part of the unmasked first implant blocking layer in the first pattern for exposing an underlying first part of the affinity layer;

implanting a first dopant at the exposed first part of the affinity layer into the underlying semiconductor material;

removing the masking for exposing a portion of the predetermined portion of the first implant blocking layer;

forming a second implant blocking layer from the second implant blocking material over a portion of the exposed first part of the affinity layer;

removing the first implant blocking layer for exposing an underlying second part of the affinity layer, the exposed second part of the affinity layer constituting a second pattern; and implanting a second dopant at the exposed second part of the affinity layer into the underlying semiconductor material.

2. The method as in claim 1, wherein the affinity layer includes polysilicon.

3. The method as in claim 1, wherein the first implant blocking layer includes silicon oxide, and the affinity layer includes polysilicon.

4. The method as in claim 2, wherein the step of forming a second implant blocking layer includes forming a second implant blocking layer having a thickness greater than about 1000 angstroms.

5. The method as in claim 3, wherein the step of forming the first implant blocking layer includes forming the first implant blocking layer having a thickness greater than about 1000 angstroms and further wherein the step of forming the second implant blocking layer includes forming the second implant blocking layer having a thickness less than or equal to the thickness of the first implant blocking layer.

6. The method as in claim 1, wherein the step of forming the second implant blocking layer includes forming the second implant blocking layer at a pressure of about 50 to about 1000 m Torr.

7. The method as in claim 1, wherein the step of forming a second implant blocking layer includes forming the second implant blocking layer so that the second implant blocking layer does not overlay the exposed portion of the first implant blocking layer.

8. The method as in claim 1, wherein the semiconductor material includes silicon.

9. The method as in claim 8, wherein the first dopant is selected from the group consisting of phosphorous, arsenic, antimony and combinations thereof and the second dopant is boron.

10. A method for fabricating complementary regions in a semiconductor material while using a single masking step, the semiconductor material having a protective layer disposed over a portion of the semiconductor material, an affinity layer disposed over a portion of the protective layer, the affinity layer having an affinity for a second implant blocking material, the second implant blocking material comprising tungsten, and a first implant blocking layer disposed over a portion of the affinity layer, comprising:
   masking a predetermined portion of the first blocking layer for forming a first pattern of the unmasked portion of the first implant blocking layer;
   removing a part of the unmasked first implant blocking layer in the first pattern for exposing an underlying first part of the affinity layer;
   implanting a first dopant at the exposed first part of the affinity layer into the underlying semiconductor material;
   removing the masking for exposing a portion of the predetermined portion of the first implant blocking layer;
   forming a second implant blocking layer from the second implant blocking material over a portion of the exposed first part of the affinity layer;
   removing the first implant blocking layer for exposing an underlying second part of the affinity layer, the exposed second part of the affinity layer constituting a second pattern; and
   implanting a second dopant at the exposed second part of the affinity layer into the underlying semiconductor material.

11. The method as in claim 10, wherein the step of forming a second implant blocking layer includes forming the second implant blocking layer so that the second implant blocking layer does not overlay the exposed portion of the first implant blocking layer.

12. The method as in claim 11, wherein the first implant blocking layer includes silicon oxide.

13. The method as in claim 10, wherein the affinity layer includes polysilicon.

14. The method as in claim 10, wherein the first implant blocking layer includes silicon oxide, and the affinity layer includes polysilicon.

15. The method as in claim 10, wherein the step of forming a second implant blocking layer includes forming a second implant blocking layer having a thickness greater than about 1000 angstroms.

16. The method as in claim 14, wherein the first implant blocking layer has a thickness greater than about 1000 angstroms and further wherein the step of forming the second implant blocking layer includes forming the second implant blocking layer having a thickness less than or equal to the thickness of the first implant blocking layer.

17. The method as in claim 10, wherein the step of forming the second implant blocking layer includes forming the second implant blocking layer at a pressure of about 50 to about 1000 m Torr.

18. The method as in claim 10, wherein the semiconductor material includes silicon.

19. The method as in claim 18, wherein the first dopant is selected from the group consisting of phosphorous, arsenic, antimony and combinations thereof and the second dopant is boron.

* * * * *